(12) United States Patent
Kim

(10) Patent No.: US 11,098,865 B2
(45) Date of Patent: Aug. 24, 2021

(54) LIGHT SOURCE, SOLAR CELL COMPLEX AND LIGHTING SYSTEM INCLUDING THE SAME

(71) Applicant: Korea Photonics Technology Institute, Gwangju (KR)

(72) Inventor: Hyojin Kim, Gwangju (KR)

(*) Notice: Subject to any disclaimer, the term of this patent is extended or adjusted under 35 U.S.C. 154(b) by 0 days.

(21) Appl. No.: 16/882,790

(22) Filed: May 26, 2020

(65) Prior Publication Data
US 2020/0378571 A1    Dec. 3, 2020

(51) Int. Cl.
*F21S 9/03*     (2006.01)
*F21V 33/00*    (2006.01)
*H01L 31/0224*  (2006.01)
*H01L 27/32*    (2006.01)

(52) U.S. Cl.
CPC ............ *F21S 9/037* (2013.01); *F21V 33/006* (2013.01); *H01L 27/3225* (2013.01); *H01L 27/3227* (2013.01); *H01L 31/0224* (2013.01)

(58) Field of Classification Search
CPC ........... F21S 9/03–037; H01L 27/3225; H01L 27/3227; H01L 31/022425–022458
See application file for complete search history.

(56) References Cited

U.S. PATENT DOCUMENTS

2012/0091473 A1 * 4/2012 Lee .................. H01L 27/288
                                                   257/81

FOREIGN PATENT DOCUMENTS

| CN | 104576679 A | * | 4/2015 | |
| CN | 108288654 A | * | 7/2018 | ............. H02S 20/22 |
| CN | 109027930 A | * | 12/2018 | ........... H01L 25/167 |
| JP | 2014-086490 A | | 5/2014 | |
| KR | 20110036219 A | * | 4/2011 | |
| KR | 10-2014-0036142 | | 3/2014 | |
| KR | 10-2014-0110873 | | 9/2014 | |
| KR | 10-2015-0002113 | | 1/2015 | |
| KR | 10-2015-0093102 | | 8/2015 | |
| KR | 20170010933 A | * | 2/2017 | |
| KR | 10-2018-0121911 | | 11/2018 | |

OTHER PUBLICATIONS

English Specification of 10-2018-0121911.
English Specification of 10-2014-0036142.
English Specification of 10-2015-0093102.
English Specification of JP2014-086490A.
English Specification of 10-2015-0002113.
English Specification of 10-2014-0110873.

* cited by examiner

Primary Examiner — Mariceli Santiago
(74) Attorney, Agent, or Firm — Antonio Ha & U.S. Patent, LLC

(57) ABSTRACT

According to an embodiment, a light source-solar cell complex comprises a plurality of layers receiving light to generate current or receiving power to emit a preset wavelength band of light and a plurality of connectors grown between the layers and transferring the current generated from the layers to an outside or transferring power from the outside to each layer.

9 Claims, 9 Drawing Sheets

LIGHT SOURCE, SOLAR CELL COMPLEX AND LIGHTING SYSTEM INCLUDING THE SAME

CROSS-REFERENCE TO RELATED APPLICATIONS

This application claims priority to Korean Patent Application No. 10-2019-0065294 filed in the Korean Intellectual Property Office on Jun. 3, 2019, the disclosure of which is incorporated by reference herein in its entirety.

TECHNICAL FIELD

Embodiments of the disclosure relate to a complex including a light source and a solar cell in one structure and a lighting system including the same.

DISCUSSION OF RELATED ART

The description of the Discussion of Related Art section merely provides information that may be relevant to embodiments of the disclosure but should not be appreciated as necessarily constituting the prior art.

As energy consumption increases, the world faces global energy issues, such as depletion of energy sources, such as coal, oil, and nuclear power, and environmental contamination. There is an ongoing worldwide effort to address the issues and develop alternative energy which is eco-friendly and infinite.

Alternative energy sources include solar, wind, wave, and geothermal energy. Various research efforts are underway to adopt alternative energy sources as new energy sources. Among others, solar power is a representative alternative energy source used in practice, which has various applications from solar power generation for household use to solar cell lighting devices.

In particular, solar cell lighting devices charge secondary cells with electric energy converted into from solar energy in the daytime using solar cells, which convert solar energy into electric energy and use the electric energy as power source for the solar cell lighting devices at nighttime. Solar cell lighting devices may be installed in various areas, e.g., coasts, mountain peaks, farmland, or mountain trails, where it is difficult to install power transmission lines, and attraction sites, theme parks, research centers, parks, gardens, or cemeteries which require a specific consideration for the purposes of environmental protection or aesthetics. Solar cell lighting devices gain popularity with no need for transmission lines, easy installation, and low installation and maintenance costs. Solar cell lighting devices are used as street lamps, landscape lighting, and security lights.

The conventional solar cell lighting device includes a solar cell, which receives solar light and converts the solar light into electric energy, and a light source, which receives the electric energy and emits light, as separate components. However, the conventional solar cell lighting device may suffer from high manufacturing costs because the solar cell and the light source are separately provided. Further, the solar cell and the light source both need to be placed in their respective proper positions, causing the solar cell lighting device bulky.

SUMMARY

According to an embodiment, there are provided a light source-solar cell complex with a light source and a lighting device in a single structure and a lighting system including the light source-solar cell complex.

According to an embodiment, a light source-solar cell complex comprises a plurality of layers receiving light to generate current or receiving power to emit a preset wavelength band of light and a plurality of connectors grown between the layers and transferring the current generated from the layers to an outside or transferring power from the outside to each layer.

The plurality of layers have different efficiencies of receiving light and generating current.

The plurality of connectors transmit incident light.

The plurality of layers emit different wavelength bands of light.

According to an embodiment, a method of manufacturing a light source-solar cell complex comprises a first growing step of growing a layer, the layer receiving light to generate current or receiving power to emit a preset wavelength band of light, a second growing step of growing a connector on top of the layer and a repeating step of repeating the first growing step and the second growing step multiple times.

A plurality of layers grown by the repeating step have different efficiencies of receiving light and generating current.

The connector grown by the second growing step transmit incident light.

A plurality of layers grown by the repeating step emit different wavelength bands of light.

According to an embodiment, a lighting system comprises a light source-solar cell complex, the light source-solar cell complex comprising a plurality of layers receiving light to generate current or receiving power to emit a preset wavelength band of light and a plurality of connectors grown between the layers and transferring the current generated from the layers to an outside or transferring power from the outside to each layer, a battery connected with each connector to store the current generated from the layers or transfer the power to each layer;

a plurality of switches connecting each connector with the battery, and a controller controlling each switch to determine whether to connect each connector with the battery.

The controller controls each switch based on whether a time is within a preset time period.

The controller controls each switch based on whether an amount of current stored in the battery is a preset reference value or less or whether an amount of current transferred from the light source-solar cell complex is a preset reference value or more.

The plurality of layers have different efficiencies of receiving light and generating current.

The plurality of connectors transmit incident light.

According to an embodiment, the light source-solar cell complex has both a light source and a lighting device in a single structure and may thus be manufactured in a reduced volume and low costs.

According to an embodiment, the light source-solar cell complex has both a light source and a lighting device in a single structure and may thus simultaneously perform charging and light emission in a single device.

DETAILED DESCRIPTION OF EXEMPLARY EMBODIMENTS

Various changes may be made to the present disclosure, and the present disclosure may come with a diversity of embodiments. Some embodiments of the present disclosure are shown and described in connection with the drawings. However, it should be appreciated that the present disclosure is not limited to the embodiments, and all changes and/or equivalents or replacements thereto also belong to the scope of the present disclosure. Similar reference denotations are used to refer to similar elements throughout the drawings.

The terms "first" and "second" may be used to describe various components, but the components should not be limited by the terms. The terms are used to distinguish one component from another. For example, a first component may be denoted a second component, and vice versa without departing from the scope of the present disclosure. The term "and/or" may denote a combination(s) of a plurality of related items as listed or any of the items.

It will be understood that when an element or layer is referred to as being "on," "connected to," "coupled to," or "adjacent to" another element or layer, it can be directly on, connected, coupled, or adjacent to the other element or layer, or intervening elements or layers may be present. In contrast, when a component is "directly connected to" or "directly coupled to" another component, no other intervening components may intervene therebetween.

The terms as used herein are provided merely to describe some embodiments thereof, but not to limit the present disclosure. As used herein, the singular forms "a," "an," and "the" are intended to include the plural forms as well, unless the context clearly indicates otherwise. As used herein, the term "comprise," "include," or "have" should be appreciated not to preclude the presence or addability of features, numbers, steps, operations, components, parts, or combinations thereof as set forth herein.

Unless otherwise defined, all terms including technical and scientific terms used herein have the same meaning as commonly understood by one of ordinary skill in the art to which the embodiments of the present disclosure belong.

It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The components, processes, steps, or methods according to embodiments of the disclosure may be shared as long as they do not technically conflict with each other.

Figure 1:
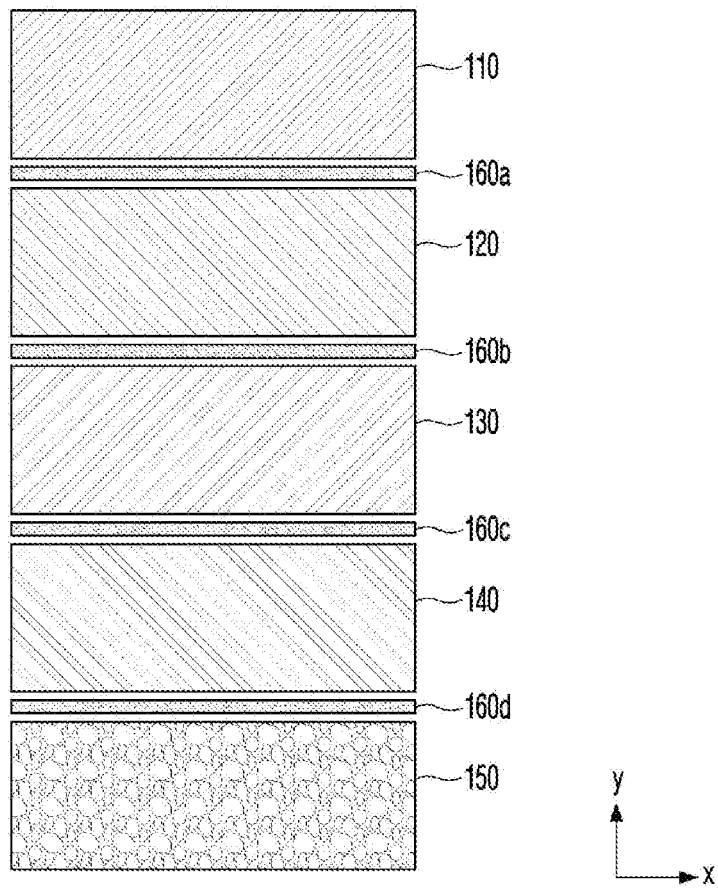
FIG. 1 is a cross-sectional view schematically illustrating a structure of a light source-solar cell complex according to an embodiment of the disclosure.

FIG. 1 is a cross-sectional view schematically illustrating a structure of a light source-solar cell complex according to an embodiment of the disclosure.

Referring to FIG. 1, a light source-solar cell complex 100 includes layers 110 to 150 and connectors 160a to 160d.

The layers 110 to 150 receive light and convert the received light into electric energy, or the layers 110 to 150 receive electric energy and emit light.

The layers 110 to 150 may be formed of various (chemical) compounds and are layered or stacked one over another. The layers 110 to 150 may be formed of various chemical compounds, such as gallium nitride (GaN)-based compounds, gallium phosphide (GaP)-based compounds or gallium arsenide (GaAs)-based compounds. Among various compounds, there are compounds that, by nature, generate no or little electric energy although receiving and absorbing light. Layers formed of such a compound are primarily used to receive electric energy and emit light. In contrast, there are compounds that, upon receiving light, smoothly generate electric energy. Layers formed of such a compound are used to not only receive electric energy and emit light but also receive light and generate electric energy. Depending on the kind of the compound, a different wavelength band of light is absorbed or emitted. To absorb most of the wavelength band of incident light or emit various wavelength bands of light, the layers 110 to 150 are formed of various compounds and are layered or stacked one over another.

The layers 110 to 150 are arranged in descending order of energy band gap along the direction (−y axis) of incident light. The layers 110 to 150 have different energy band gaps depending on the kind of the compounds. The layer with the larger energy band gap absorbs or emits a shorter wavelength band of light, and the layer with the smaller energy band gap absorbs or emits a longer wavelength band of light. In this case, when incident onto the layer, a longer wavelength of light than the energy band gap of the layer passes through the layer, but a shorter wavelength of light than the energy band gap of the layer is absorbed by the layer. Where a layer with a smaller energy band gap is positioned at the top of the layered structure along the direction of incident light, shorter wavelength bands of light than the energy band gap of the layer are absorbed by the layer. Thus, the layers positioned under the top layer may not absorb the light. To address this issue, the layers 110 to 150 are arranged in descending order of energy band gap along the direction (−y axis) of incident light, e.g., the layer with the larger energy band gap positioned higher than the layer with the smaller energy band gap. Thus, each layer may sequentially receive the light that has passed through the layer positioned thereabove along the +y axis direction.

The connectors 160a to 160d are positioned between the layers 110 to 150 to transfer power (or electricity) to the layers 110 to 150 or to receive electric energy from the layers 110 to 150. Each connector 160a to 160d is formed of a compound similar to its adjacent layer 110 to 150. Thus, the connectors 160a to 160d are sequentially grown with the layers, without the need for a separate process, such as deposition. Each connector 160a to 160d may be formed with its adjacent layer in a single process and be positioned between its two adjacent layers 110 to 150. The connectors 160a to 160d receive power (or electricity) from the outside and transfer the received power (or electricity) to the layers 110 to 150, or the connectors 160a to 160d transfer electric energy generated from the layers 110 to 150 to the outside.

Figure 2:
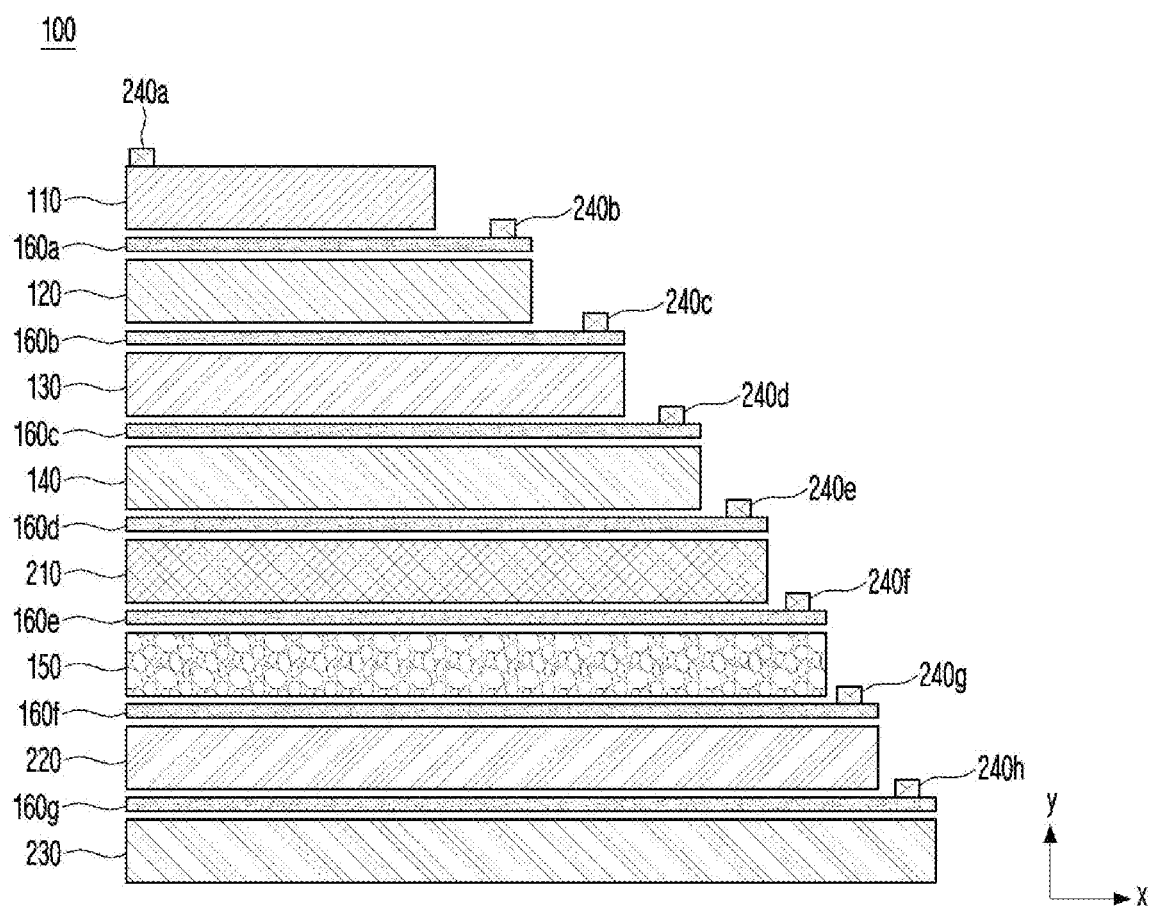
FIG. 2 is a cross-sectional view illustrating a structure of a light source-solar cell complex according to an embodiment of the disclosure.

FIG. 2 is a cross-sectional view illustrating a structure of a light source-solar cell complex according to an embodiment of the disclosure.

Referring to FIG. 2, a light source-solar cell complex 100 may include more layers 110 to 150 and 210 to 230 than those of FIG. 1 and more connectors 160a to 160g than those of FIG. 1. The light source-solar cell complex 100 further includes electrodes 240a to 240h.

The layers 110 to 150 and 210 to 230 are divided into a first group of layers 110 to 130 and a second group of layers 210, 140, 150, 220, and 230. Each layer 110 to 150 and 210 to 230 includes a window layer, an emitter layer, a base layer, and a back surface field (BSF) layer. The window layer and the emitter layer absorb or emit light, allowing each layer to operate as a light source or a solar cell.

The first group of layers 110 to 130 are positioned at the top of the layered structure, where first receive light, and absorb or emit a short wavelength band of light. The first group of layers 110 to 130 may be formed of a gallium nitride (GaN)-based compound which has a large energy band gap. The uppermost layer 110 may be formed of aluminum gallium nitride (AlGaN), and its underneath layer 120 may be formed of gallium nitride (GaN). The lowermost layer 130 of the first group may be formed of indium gallium nitride (InGaN). Since the first group of layers 110 to 130 are formed of gallium nitride (GaN)-based compounds, the first group of layers 110 to 130 have a large energy band gap and may thus absorb or emit a short wavelength band (e.g., 380 nm to 570 nm) of light. By the nature of GaN-based compounds, when the first group of layers 110 to 130 receive light, electrons-holes are created inside the layers. Since the created electrons-holes are significantly lost while being transferred to the electrodes, the efficiency of electric energy generation is significantly lowered. Thus, the first group of layers 110 to 130 primarily operate as light sources that receive the power, which is transferred through the electrodes 240a to 240c and the connectors 160a and 160b, and emit a short wavelength band of light.

The second group of layers 210, 140, 150, 220, and 230 absorb the relatively long wavelength band of light, which has been transmitted through the first group of layers 110 to 130, generating electric energy or emitting a long wavelength band of light. The second group of layers 210, 140, 150, 220, and 230 may be formed of a gallium phosphide (GaP)-based compound, gallium arsenide (GaAs)-based compound, or indium phosphide (InP)-based compound which has a relatively small energy band gap. Thus, the second group of layers absorb or emit a longer wavelength band (e.g., 570 nm to 1,000 nm or 570 nm to 1,700 nm) of light than the first group of layers. The uppermost layer 210 in the second group of layers may be formed of aluminum indium gallium phosphide (AlInGaP) to be able to absorb and emit the shortest wavelength band of light among the second group of layers, and its underneath layer 140 may be formed of indium gallium phosphide (InGaP) to be able to absorb and emit a longer wavelength band of light than the uppermost layer 210. Similarly, the layer 150 formed of gallium arsenide (GaAs) may be disposed under the layer 140, and layers 220 and 230 formed of indium gallium arsenide (InGaAs) may be disposed under the layer 150. The second group of layers 210, 140, 150, 220, and 230 absorb light of the wavelength bands corresponding to their constituting compounds, smoothly generate electric energy, receive power from the outside, and emit their respective wavelength bands of light.

The light from each layer is emitted both upwards (in the direction of +y axis) and downwards (in the direction of −y axis). As described above, the longer wavelength band of light than the energy band gap of the layer is transmitted through the layer, and the other light is absorbed by the layer. Thus, the light emitted upwards from each layer may be transmitted through the layers positioned thereabove, and the light emitted downwards from each layer may not be transmitted through, but rather absorbed by, the layers positioned thereunder. The light source-solar cell complex 100 may emit light in one direction. Since the light absorbed by the lower layers is used to generate electric energy from the lower layers, the light source-solar cell complex 100 has relatively high electric energy generation efficiency.

Although FIG. 2 illustrates an example in which the light source-solar cell complex 100 includes layers formed of compounds which absorb or emit light of a wavelength band ranging from 380 nm to 750 nm or ranging from 280 nm to 1,700 nm, embodiments of the disclosure are not limited thereto. For example, a layer or layers formed of a compound that absorbs or emits a longer wavelength band (e.g., 2,000 nm to 2,500 nm) of light than that, e.g., 1,700 nm, of infrared light may be sequentially disposed under the layer 230. In such a case, the light source-solar cell complex may have more superior electric energy generation efficiency.

Each connector 160a to 160g is formed between two adjacent layers to transfer power received through its corresponding electrode 240a to 240h to its adjacent layer or to transfer electric energy generated from its adjacent layer through its corresponding electrode 240a to 240h to the outside.

Each connector 160a to 160g is formed of a compound similar to that of its adjacent layer, between its two adjacent layers. Thus, like the layers, each connector 160a to 160g may also transmit the incoming light depending on the wavelength and transfer the light to the layer positioned thereunder.

Figure 6:
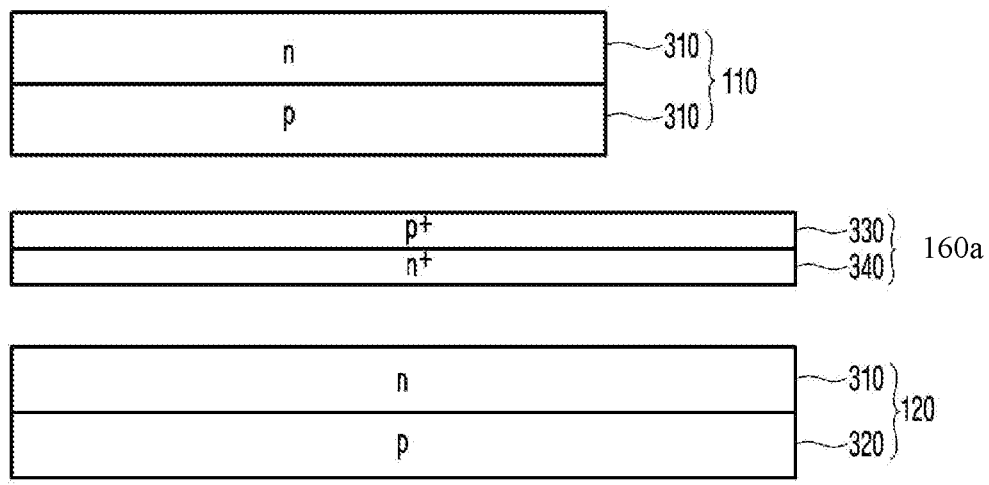
FIG. 6 is a view illustrating a structure of connectors and layers in a light source-solar cell complex according to an embodiment.

Each connector 160a to 160g transfers power to its adjacent layer or transfers electric energy generated from its adjacent layer to the outside. As shown in FIG. 6, each connector 160a to 160g may be formed of a tunnel junction. This is described below in detail with reference to FIG. 6.

FIG. 6 is a view illustrating a structure of connectors and layers in a light source-solar cell complex according to an embodiment. Although FIG. 6 illustrates the connector 160a formed between the layer 110 and the layer 120, this is merely an example, and the other connectors and layers may also have substantially the same structure.

The layer 110 and the layer 120 each may include an n-type semiconductor 310 at the top and a p-type semiconductor 320 under the n-type semiconductor 310.

In such a case, the upper portion 330 of the connector 160a, which is positioned adjacent to the lower portion 320 of the layer 110 formed of the p-type semiconductor may include a high-doped p-type semiconductor, and the lower portion 340 of the connector 160a, which is positioned adjacent to the upper portion 310 formed of the high-doped n-type semiconductor, may include a high-doped n-type semiconductor.

As such, the connector is implemented as a tunnel junction and may thus advantageously be grown along with its adjacent layer. For example, if the connector is implemented in other configuration than the tunnel junction, the connector is formed in a separate process (e.g., deposition) from the growth of the layer. If so, the connector and its adjacent layer may not be formed in the same process and thus a hassle arises. However, as the connector is implemented as a tunnel junction, such issue may be addressed.

Although FIG. 6 illustrates an example in which the upper portion of the layer is formed of an n-type semiconductor and the lower portion of the layer is formed of a p-type semiconductor, the opposite case may stand. For example, the upper portion of the layer is formed of a p-type semiconductor and the lower portion of the layer is formed of an n-type semiconductor. In such a case, the connector may be composed of an upper portion including a high-doped n-type semiconductor and a lower portion including a high-doped p-type semiconductor.

Referring back to FIG. 2, each electrodes 240a to 240n may be disposed on one exposed surface of its corresponding layer or connector 160a to 160g to transfer power to the layer or connector or to transfer electric energy from the layer or connector to the outside.

The electrodes 240a to 240c, which are disposed directly on the first group of layers 110 to 130 or are disposed on the connectors 160a to 160c between the first group of layers, transfer power to the layer 110 or the connectors 160a and 160b. The electrodes 240a to 240c transfer power from the outside to the layer 110 or connectors 160a and 160b, allowing each layer to emit a specific wavelength band of light. The wavelength band of light emission is varied depending on which electrode the power is transferred through. For example, when power is transferred through the electrode 240a and the electrode 240b, the layer 110 alone emits a shortest wavelength band (such as of violet) of light. When power is transmitted through the electrode 240a and the electrode 240d, the first group of layers 110 to 130 all emit their respective wavelength bands of light. Thus, a short wavelength band (e.g., 380 nm to 570 nm) of light is emitted from the first group of layers 110 to 130. As described above, since the layers perform only light emission due to significantly lowered electric energy generation efficiency, only one electrode is disposed to supply power to its corresponding layer or connector.

The electrodes 240d to 240h disposed on the connectors 160c to 160g between the second group of layers transfer power to the connectors 160c to 160g. Unlike the electrodes disposed on the connectors between the first group of layers, a plurality of electrodes 240d to a plurality of electrodes 240h may be disposed on their respective connectors. The second group of layers not only receive power and emit light but also receive light and generate electric energy. Thus, an electrode for use to supply power to each of the second group of layers and an electrode for receiving electric energy generated from each of the second group of layers may be needed. Thus, a plurality of electrodes (not shown) are disposed on each of the connectors 160c to 160g between the second group of layers. Any one of the electrodes disposed on each connector 160c to 160g transfers power from the outside to the connector, as does the electrode 240a to 240c. The other one of the electrodes disposed on each connector 160c to 160g transfers electric energy generated from each layer to the outside. As for the electrodes 240a to 240c, the wavelength band of light emission is varied depending on which one of the electrodes 240d to 240h power is transferred through.

Figure 3:
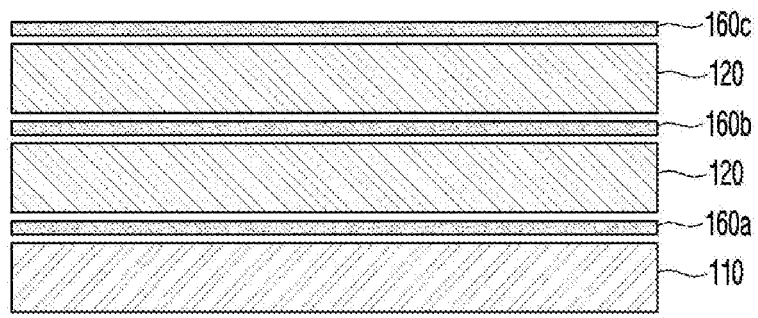
FIG. 3 is a view illustrating the growth of some layers in a light source-solar cell complex according to an embodiment.
Figure 4:
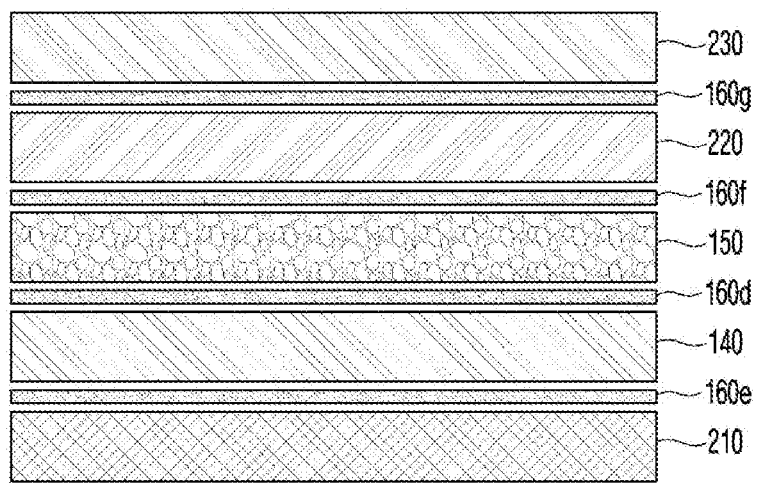
FIG. 4 is a view illustrating the growth of the remaining layers in the light source-solar cell complex according to an embodiment.

FIG. 3 is a view illustrating the growth of some layers in a light source-solar cell complex according to an embodiment. FIG. 4 is a view illustrating the growth of the remaining layers in the light source-solar cell complex according to an embodiment.

Referring to FIGS. 3 and 4, a first group of layers (and connectors therebetween) and a second group of layers (and connectors therebetween) are grown in separate processes. The compound constituting the first group of layers and the compound constituting the second group of layers have different lattice structures and, thus, may not be grown in the same growing process. Thus, the first group of layers and the second group of layers are grown in different growing processes.

In growing each layer, the layers 110 and 210 which have the largest energy band gap are first grown on a substrate, e.g., a sapphire substrate, and connectors and layers with smaller energy band gaps are sequentially grown thereon. In typical layer growth, it is advantageous to grow layers in the order from the largest energy band gap to the smallest energy band gap.

In this case, some of the second group of layers are formed of different compounds and thus need separate growing processes, as are the first group of layers and the second group of layers. Methods of forming the second group of layers are illustrated in FIGS. 11 and 12.

Figure 11:
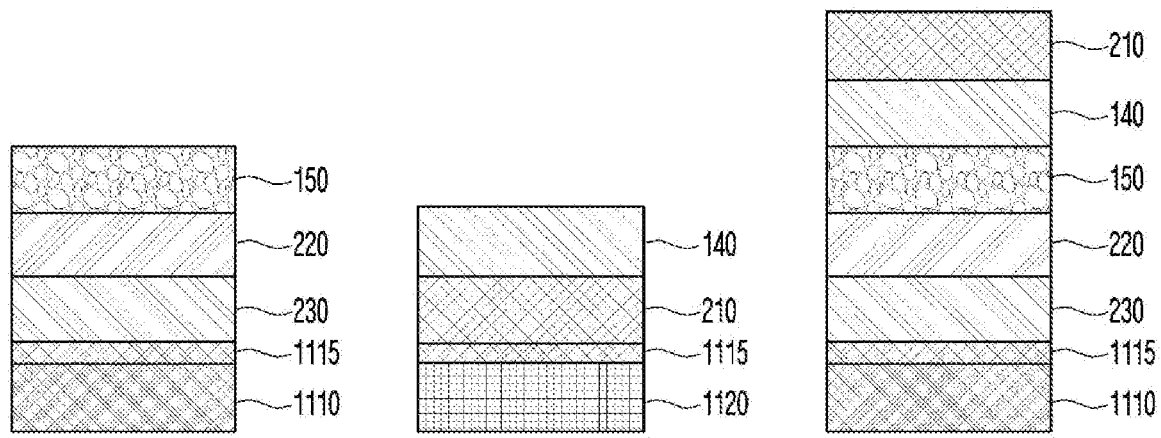
FIG. 11 is a view illustrating an example of forming a second group of layers according to an embodiment.

FIG. 11 is a view illustrating an example of forming a second group of layers according to an embodiment. FIG. 12 is a view illustrating an example of forming a second group of layers according to an embodiment.

Referring to FIG. 11, layers formed of similar compounds are grown on separate substrates 1110 and 1120. A sacrificial layer 1115 is grown on each substrate 1110 and 1120, and then, a connector and layers with smaller energy band gaps are sequentially grown thereon. Thereafter, the layers 140 and 210 are separated from the layers, which have been grown on the substrate (1120 of FIG. 11) and are to be bonded at an upper position, and then, are bonded to the layers grown on the other substrate 1110. As such, as the layers are bonded together, the layers formed of different compounds may form a single layered (or stacked) structure.

Figure 12:
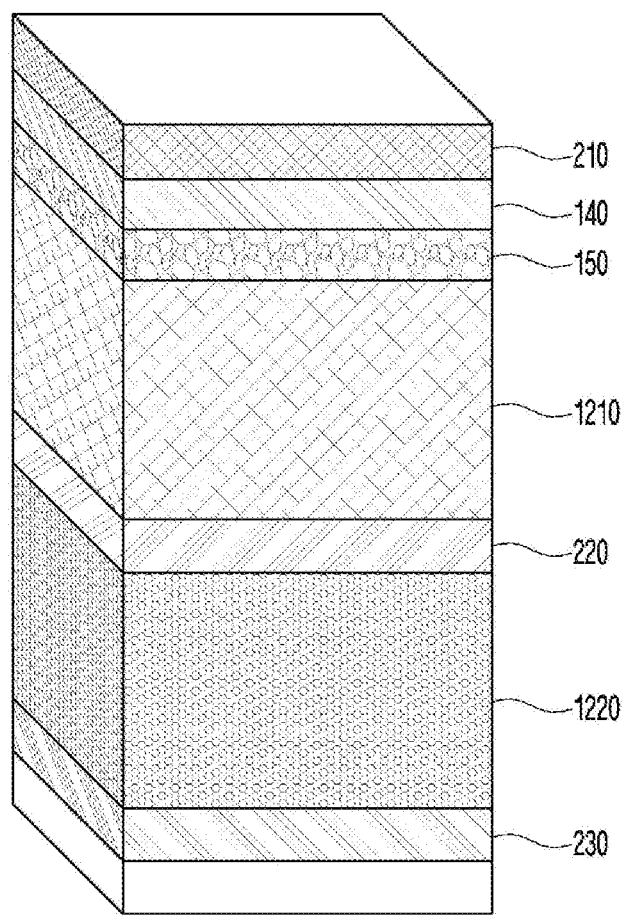
FIG. 12 is a view illustrating an example of forming a second group of layers according to an embodiment.

Referring to FIG. 12, a layer formed of a specific compound is grown on a substrate, and grating layers 1210 and 1220 may then be grown before layers formed of different compounds are grown. The grating layers 1210 and 1220 have light transmittance and thus do not disturb arrival of light to each layer. The grating layers 1210 and 1220 have an intermediate lattice constant between the lattice constants of the compounds of the layers and thus allow the compounds with different lattice constants to connect together without any problem. Each grating layer 1210 and 220 may have an intermediate, fixed or gradually varied lattice constant between the lattice constants of its two adjacent layers. As such, as the grating layers 1210 and 1220 are grown in the middle, the second group of layers may be continuously grown on a single substrate without a separate bonding process.

Figure 5:
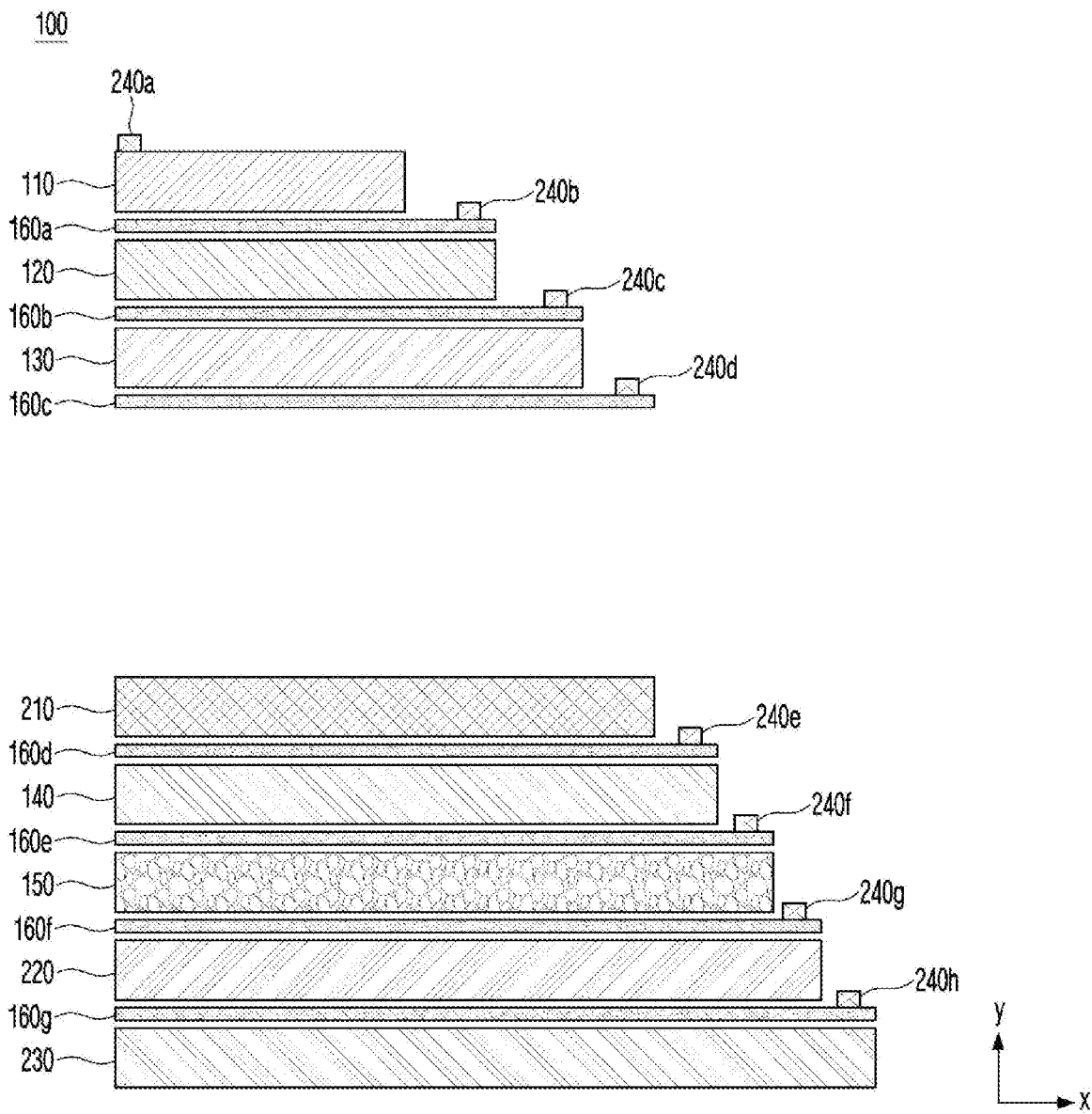
FIG. 5 is a view illustrating an example in which layers in a light source-solar cell complex are bonded together according to an embodiment.

FIG. 5 is a view illustrating an example in which layers in a light source-solar cell complex are bonded together according to an embodiment.

A first group of layers (and connectors therebetween) and a second group of layers (and connectors therebetween) grown in different growing processes undergo a bonding process, e.g., wafer bonding, allowing them a layered (or stacked) structure. In this case, each layer and the connector adjacent thereto are subjected to an etching process before or after bonding. The etching process is performed to expose a portion of the connector adjacent to the particular layer to the outside so that an electrode may be disposed on the portion of the connector. As such, to allow the portion of each connector, where an electrode is to be disposed to be exposed to the outside, each layer and its connector undergo an etching process. The upper layer, in the direction of +y axis, and its connector may be etched to leave a larger such portion, and the lower layer and its connector may be etched to leave a relatively smaller such portion. Thus, the connector adjacent to each layer has a portion that is exposed to the outside and allows an electrode to be disposed thereon.

Figure 7:
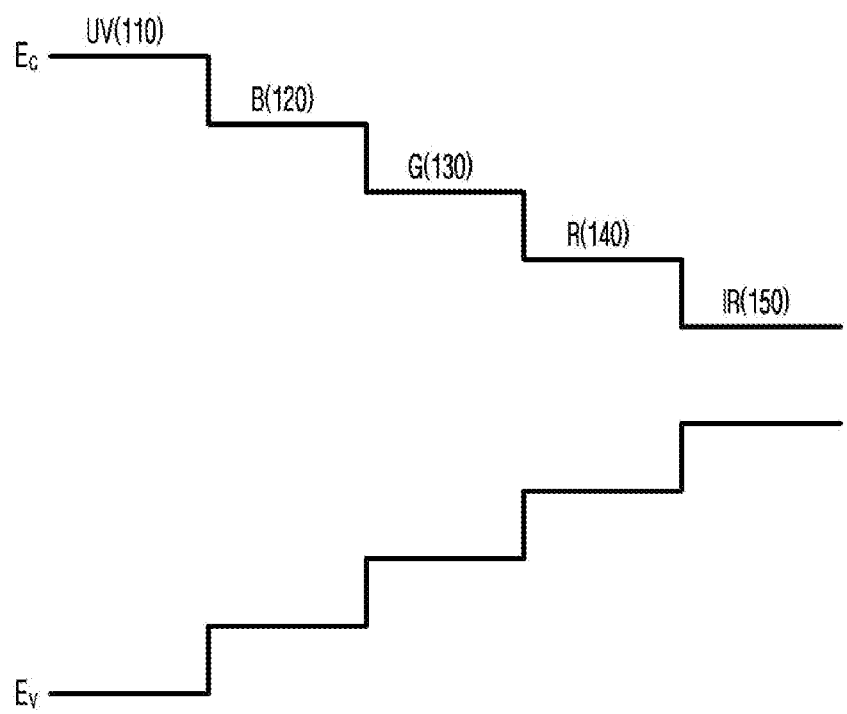
FIG. 7 is a view schematically illustrating an energy band gap between layers in a light source-solar cell complex according to an embodiment.

FIG. 7 is a view schematically illustrating an energy band gap between layers in a light source-solar cell complex according to an embodiment.

As described above, the layer 110 which is disposed at the top and emits the shortest wavelength band (such as of, e.g., ultraviolet (UV) or violet) of light has the largest energy band gap among the layers, and the energy band gaps of the lower layers reduce downwards.

Thus, shorter wavelength bands of light are absorbed by the upper layer, and only longer wavelength bands of light are incident onto, and are absorbed by, the lower layer. In contrast, the light emitted from the lower layer is transmitted upwards through the upper layers, but the light emitted downwards from the upper layer may not be transmitted through, but rather absorbed by, the lower layers.

The light source-solar cell complex described above in connection with FIGS. 1 to 7 may be manufactured by the above-described processes using various manufacturing devices, e.g., a semiconductor, light source, or solar cell manufacturing device. Although the second group of layers grown are formed of a gallium phosphide-based compound and a gallium arsenide-based compound for ease of description, embodiments of the disclosure are not limited thereto. For example, any one of the gallium phosphide compound or gallium arsenide-based compound may be replaced with an indium phosphide-based compound. Further, the second group of layers are not limited as formed only of any one compound, but may rather be formed of a combination of an aluminum phosphide-based compound, aluminum arsenide-based compound, gallium phosphide-based compound, gallium arsenide-based compound, indium phosphide-based compound, and indium arsenide-based compound to form $Al_{(x)(y)}Ga_{(1-x)(y)}In_{(y)}As_{(m)}P_{(1-m)}$ (where, x+y+z=1, m+n=1).

Figure 8:
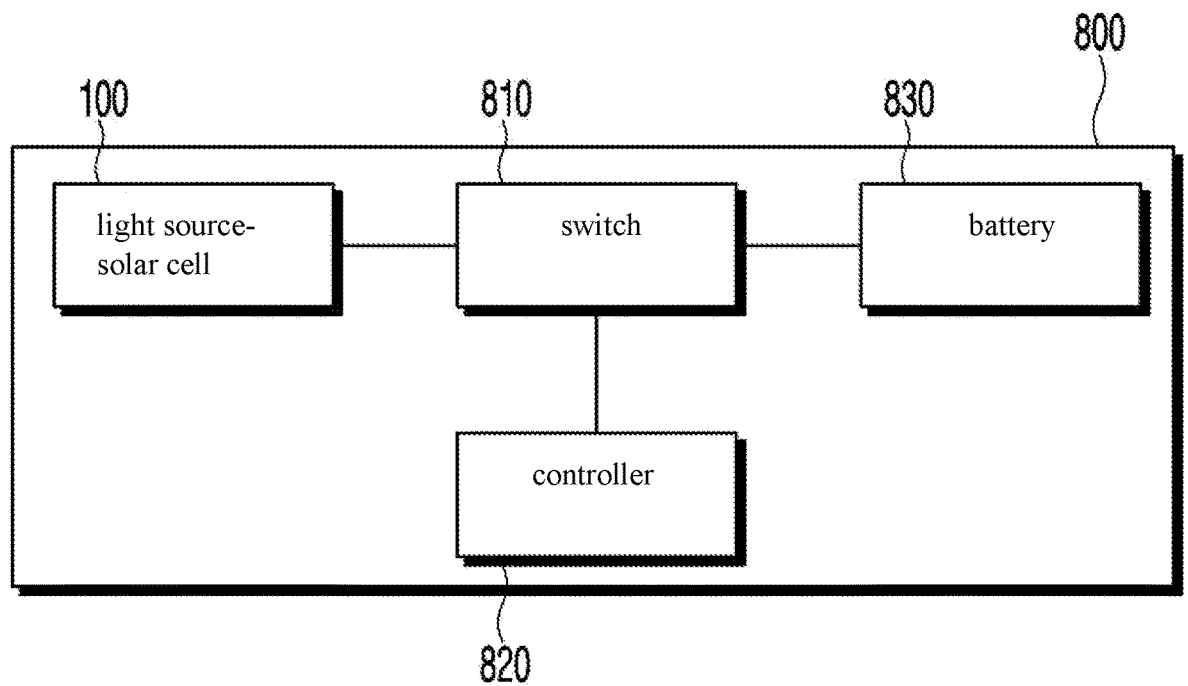
FIG. 8 is a view illustrating a configuration of a lighting system according to an embodiment.

FIG. 8 is a view illustrating a configuration of a lighting system according to an embodiment.

Referring to FIG. 8, according to an embodiment, a lighting system 800 includes a light source-solar cell complex 100, a switch 810, a controller 820, and a battery 830.

As described above in connection with FIGS. 1 to 7, the light source-solar cell complex 100 absorbs light to generate electric energy or receives power to emit light. The light source-solar cell complex 100 is connected with the battery 830 via an electrode disposed on each connector to receive power or transfer generated electric energy.

The switch 810 controls the connection between the electrode disposed on each connector of the light source-solar cell complex 100 and the battery 830 under the control of the controller 820. There may be provided a plurality of switches 810.

The controller 820 controls the connection of the switch 810 based on whether the amount of the light incident onto the light source-solar cell complex 100 is a preset reference value or more. The controller 820 may determine whether to allow the light source-solar cell complex 100 to perform charging or to emit what wavelength band of light depending on which connector's electrode is controlled to connect to the battery 830. For example, when the electrode 240a and the electrode 240d are connected with the battery by the controller 820, the light source-solar cell complex 100 emits a short wavelength band of light. When the electrode 240e and electrode 240h, which allow power to be applied to the layers, are connected with the battery by the controller 820, the light source-solar cell complex 100 emits a relatively long wavelength band of light. When the electrode 240e and electrode 240h, which allow generated electric energy to be transferred to the battery, are connected with the battery by the controller 820, the light source-solar cell complex 100 absorbs a relatively long wavelength band of light and generates electric energy. The controller 820 may have a separate sensor to determine whether the amount of light incident onto the light source-solar cell complex 100 is a preset reference value or more, or the controller 820 may make such determination in an indirect manner as follows. The controller 820 may indirectly determine the amount of the light incident onto the light source-solar cell complex 100 based on the amount charged to the battery 830 or to the light source-solar cell complex 100 at the current time. The controller 820 may determine that a sufficient amount of light may be incident onto the light source-solar cell complex 100 typically in a morning or afternoon time period. When the amount charged to the battery 830 is a reference value or less, the controller 820 may determine that there was continuous light radiation and thus the amount of light incident onto the light source-solar cell complex 100 will increase soon. When the amount charged to the light source-solar cell complex 100 is a predetermined reference value or more, the controller 820 may determine that the amount of light incident onto the light source-solar cell complex 100 is large.

The controller 820 may determine whether the current time is within a preset time period to thereby control the connection of the switch 810. The preset time period may be a morning and afternoon time period during which the amount of the light incident onto the light source-solar cell complex 100 increases. When the current time is within the preset time period, the controller 820 may control the switch to connect the electrodes 240e to 240h to the battery 830 so that a specific layer may absorb a specific wavelength band of light, generate electric energy, and transfer the electric energy to the battery. When the current time is out of the preset time period, the controller 820 may control the switch to connect the electrode to the battery so that a specific layer emits a specific wavelength band of light. For example, when the electrode 240a and the electrode 240h are connected with the battery 830 under the control of the controller 820, the light source-solar cell complex 100 may emit light of all of the wavelength bands from that of UV to that of IR.

The controller 820 may determine whether the amount charged to the light source-solar cell complex 100 is the preset reference value or more or whether the amount charged to the battery 830 is the preset reference value or lower, thereby controlling the connection of the switch 810. When the amount charged to the light source-solar cell complex 100 is the preset reference value or more or the amount charged to the battery 830 is the preset reference value or less, the controller 820 may recognize the context where the light source-solar cell complex 100 needs to generate electric energy and charges the battery 830 with the electric energy. In contrast, when the amount charged to the light source-solar cell complex 100 is the preset reference value or less or the amount charged to the battery 830 is the preset reference value or more, the controller 820 may recognize the context where the light source-solar cell complex 100 needs to emit a specific wavelength band of light. In each context, the controller 820 controls a switch for charging the battery with the generated electric energy or a switch for emitting a specific wavelength band of light to connect to the battery.

The battery 830 receives and stores electric energy generated from the light source-solar cell complex 100 or provides power to the light source-solar cell complex 100. When the battery 830 is connected with the layer, which generates electric energy, in the light source-solar cell complex 100 under the control of the controller 820, the battery 830 receives and stores the electric energy generated by the layer. In contrast, when the battery 830 is connected with the layer, which generates no electric energy, in the light source-solar cell complex 100 under the control of the controller 820, the battery 830 supplies the stored electric energy to the layer to allow the layer to emit light. As such, as the battery 830 stores the generated electric energy, the light source-solar cell complex 100 may be operated while receiving no or minimum energy necessary for emitting light from the outside.

Figure 9:
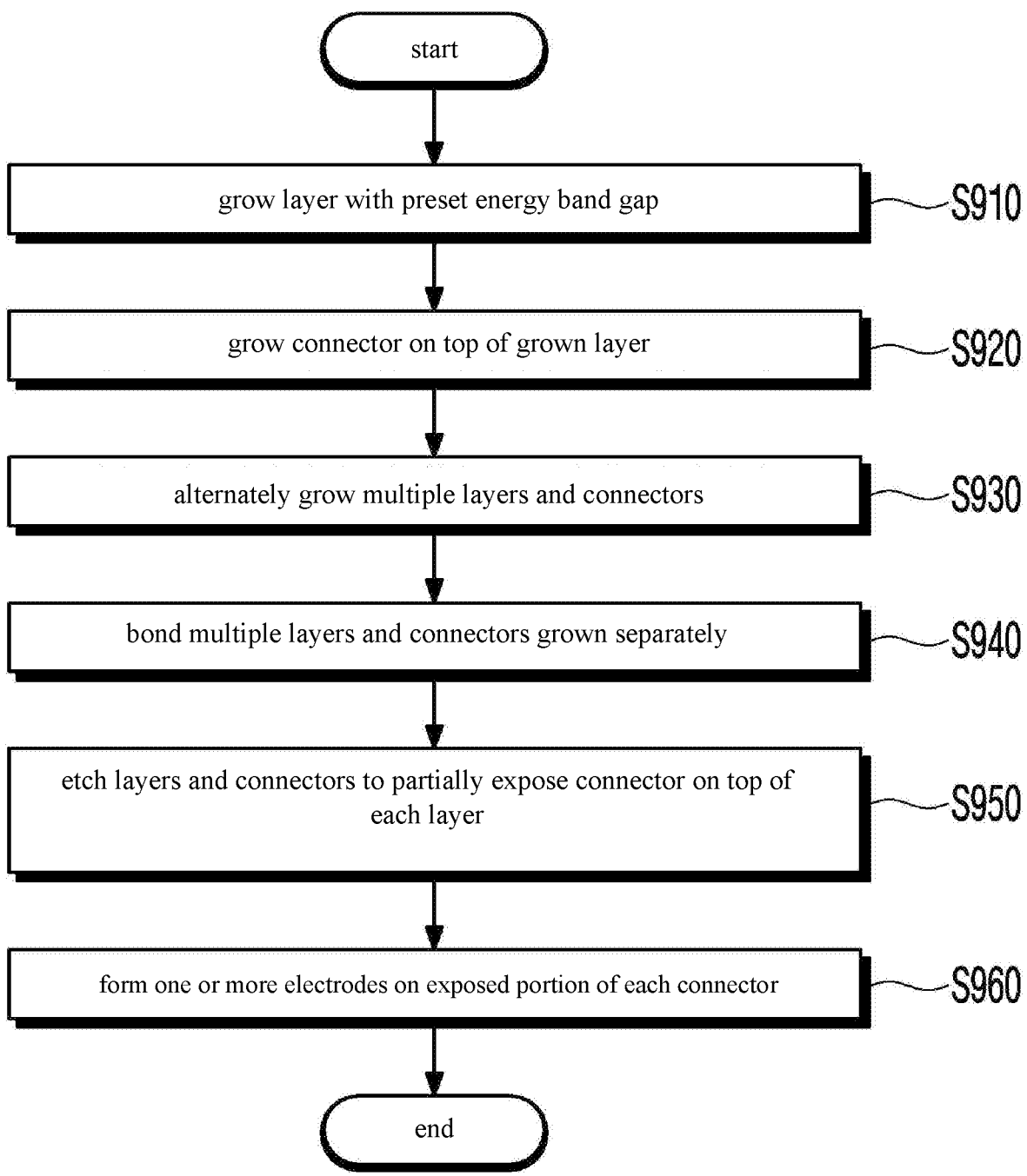
FIG. 9 is a flowchart illustrating a method of manufacturing a light source-solar cell complex according to an embodiment.

FIG. 9 is a flowchart illustrating a method of manufacturing a light source-solar cell complex according to an embodiment.

A manufacturing device (not shown) grows a layer with a preset energy band gap (S910). Since the first group of layers and the second group of layers have different lattice structures, the first group of layers and the second group of layers are grown separately.

The manufacturing device (not shown) grows a connector on top of the grown layer (S920).

The manufacturing device (not shown) alternately grows a plurality of layers and connectors (S930). The manufacturing device (not shown) alternately grows the plurality of layers and connectors by repeating the above-described steps S910 and S920.

The manufacturing device (not shown) bonds the plurality of grown layers and connectors (S940). The manufacturing device (not shown) bonds the first group of layers (including the connectors) and the second group of layers (including the connectors) which have been separately grown.

The manufacturing device (not shown) etches the layers and connectors so that a portion of the connector grown on each layer is exposed (S950).

The manufacturing device (not shown) forms one or more electrodes on the exposed portion of each connector (S960). One electrode may be disposed on each connector between the first group of layers to supply power to the connector, and two electrodes may be disposed on each connector between the second group of layers to supply power to the connector and to transfer electric energy generated from the layer to the battery.

Figure 10:
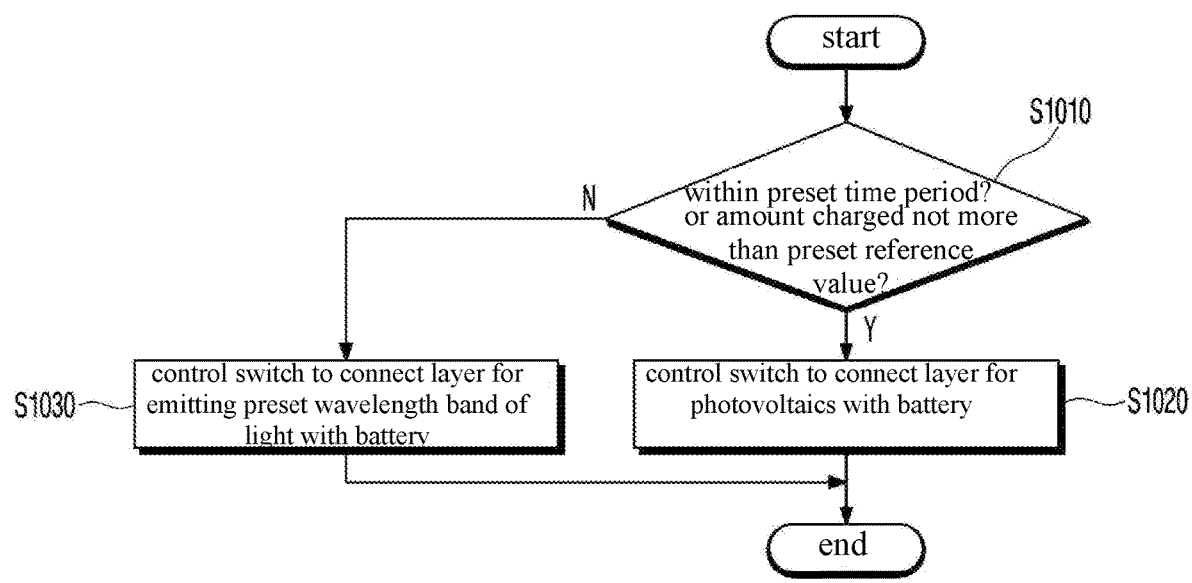
FIG. 10 is a flowchart illustrating a method of operating a lighting system according to an embodiment.

FIG. 10 is a flowchart illustrating a method of operating a lighting system according to an embodiment.

The controller 820 determines whether the current time is in a preset time period or whether the amount charged is a preset reference value or less (S1010).

When the current time is in the preset time period or the amount charged is the preset reference value or less, the controller 820 controls the switch 820 to connect the layer for performing photovoltaics with the battery 830 (S1020).

When the current time is not in the preset time period or the amount charged is not the preset reference value or less, the controller 820 controls the switch 820 to connect the layer for emitting a preset wavelength band of light with the battery 830 (S1030).

Although FIGS. 9 and 10 illustrate that the steps are sequentially performed, this merely provides an embodiment of the disclosure. It would readily be appreciated by a skilled artisan that the steps of FIGS. 9 and 10 are not limited to the order shown but may rather be performed in a different order, one or more of the steps may simultaneously be performed, or other various modifications or changes may be made thereto without departing from the scope of the disclosure The steps or processes described above in connection with FIGS. 9 and 10 may be implemented as computer-readable code in a recording medium. The computer-readable recording medium includes all types of recording devices storing data readable by a computer system. The computer-readable recording medium includes a storage medium, such as a magnetic storage medium (e.g., a ROM, a floppy disk, or a hard disk) or an optical reading medium (e.g., a CD-ROM or a DVD). Further, the computer-readable recording medium may be distributed to computer systems connected via a network, and computer-readable codes may be stored and executed in a distributed manner.

The above-described embodiments are merely examples, and it will be appreciated by one of ordinary skill in the art various changes may be made thereto without departing from the scope of the present disclosure. Accordingly, the embodiments set forth herein are provided for illustrative purposes, but not to limit the scope of the present disclosure, and should be appreciated that the scope of the present disclosure is not limited by the embodiments. The scope of the present disclosure should be construed by the following claims, and all technical spirits within equivalents thereof should be interpreted to belong to the scope of the present disclosure.

What is claimed is:

1. A light source-solar cell complex, comprising:
    a plurality of layers receiving light to generate current or receiving power to emit a preset wavelength band of light; and
    a plurality of connectors grown between the layers and transferring the current generated from the layers to an outside or transferring power from the outside to each layer, wherein
    the plurality of layers are arranged in descending order of energy band gap along a direction in which the light is received, wherein
    the plurality of layers include a first group of layers and a second group of layers under the second group of layers along the direction, wherein
    the first group of layers emit a relatively short wavelength band of light, and wherein
    the second group of layers absorbs a relatively long wavelength band of light passed through the first group of layers to emit electric energy or emit a relatively long wavelength band of light.

2. The light source-solar cell complex of claim 1, wherein the plurality of layers have different efficiencies of receiving light and generating current.

3. The light source-solar cell complex of claim 1, wherein the plurality of connectors transmit incident light.

4. The light source-solar cell complex of claim 1, wherein the plurality of layers emit different wavelength bands of light.

5. A lighting system, comprising:
    a light source-solar cell complex, the light source-solar cell complex comprising a plurality of layers receiving light to generate current or receiving power to emit a preset wavelength band of light and a plurality of connectors grown between the layers and transferring the current generated from the layers to an outside or transferring power from the outside to each layer;

a battery connected with each connector to store the current generated from the layers or transfer the power to each layer;

a plurality of switches connecting each connector with the battery; and a controller controlling each switch to determine whether to connect each connector with the battery, wherein the plurality of layers are arranged in descending order of energy band gap along a direction in which the light is received, wherein the plurality of layers include a first group of layers and a second group of layers under the second group of layers along the direction, wherein the first group of layers emit a relatively short wavelength band of light, and wherein the second group of layers absorbs a relatively long wavelength band of light passed through the first group of layers to emit electric energy or emit a relatively long wavelength band of light.

6. A lighting system, comprising:

a light source-solar cell complex, the light source-solar cell complex comprising a plurality of layers receiving light to generate current or receiving power to emit a preset wavelength band of light and a plurality of connectors grown between the layers and transferring the current generated from the layers to an outside or transferring power from the outside to each layer;

a battery connected with each connector to store the current generated from the layers or transfer the power to each layer;

a plurality of switches connecting each connector with the battery; and a controller controlling each switch to determine whether to connect each connector with the battery, wherein the controller controls each switch based on whether a time is within a preset time period.

7. The lighting system of claim 6, wherein the controller controls each switch based on whether an amount of current stored in the battery is a preset reference value or less or whether an amount of current transferred from the light source-solar cell complex is a preset reference value or more.

8. The lighting system of claim 6, wherein the plurality of layers have different efficiencies of receiving light and generating current.

9. The lighting system of claim 6, wherein the plurality of connectors transmit incident light.

* * * * *